(12) United States Patent
Yao et al.

(10) Patent No.: US 11,367,740 B2
(45) Date of Patent: Jun. 21, 2022

(54) ARRAY SUBSTRATE, MANUFACTURING METHOD THEREOF, FLEXIBLE DISPLAY PANEL AND DISPLAY DEVICE

(71) Applicant: BOE TECHNOLOGY GROUP CO., LTD., Beijing (CN)

(72) Inventors: Qi Yao, Beijing (CN); Yingwei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 815 days.

(21) Appl. No.: 16/084,452

(22) PCT Filed: Jan. 8, 2018

(86) PCT No.: PCT/CN2018/071747
§ 371 (c)(1),
(2) Date: Sep. 12, 2018

(87) PCT Pub. No.: WO2018/223696
PCT Pub. Date: Dec. 13, 2018

(65) Prior Publication Data
US 2021/0202530 A1 Jul. 1, 2021

(30) Foreign Application Priority Data
Jun. 9, 2017 (CN) .......................... 201710433423.6

(51) Int. Cl.
*H01L 27/12* (2006.01)
*H01L 29/786* (2006.01)
(Continued)

(52) U.S. Cl.
CPC ........ *H01L 27/124* (2013.01); *H01L 27/1218* (2013.01); *H01L 27/1248* (2013.01);
(Continued)

(58) Field of Classification Search
CPC ........... H01L 29/7866; H01L 29/78675; H01L 29/66757; H01L 29/78669;
(Continued)

(56) References Cited

U.S. PATENT DOCUMENTS 6,887,742 B2 * 5/2005 Baek ....................... H01L 27/12
438/149
10,624,582 B2 * 4/2020 Liu ....................... H01L 27/1225
(Continued)

FOREIGN PATENT DOCUMENTS

CN 104485349 A 4/2015
CN 104900659 A 9/2015
(Continued)

OTHER PUBLICATIONS

First Chinese Office Action dated Jul. 4, 2018, received for corresponding Chinese Application No. 201710433423.6.
(Continued)

*Primary Examiner* — Scott B Geyer
(74) *Attorney, Agent, or Firm* — Kinney & Lange, P.A.

(57) ABSTRACT

The present disclosure provides an array substrate, a manufacturing method thereof, a flexible display panel, and a display device, all for achieving a frame-free full-screen flexible display product. The array substrate provided in the present disclosure comprises a flexible base substrate, a thin film transistor on a first surface of the flexible base substrate, and a wiring terminal for transmitting a signal to an electrode of the thin film transistor on a second surface of the flexible base substrate opposite to the first surface. The electrode of the thin film transistor is electrically connected to the wiring terminal through a via hole penetrating the flexible base substrate.

13 Claims, 6 Drawing Sheets

(51) Int. Cl.
H01L 29/66 (2006.01)
H01L 27/32 (2006.01)
H01L 51/00 (2006.01)

(52) U.S. Cl.
CPC ...... *H01L 27/1266* (2013.01); *H01L 27/3262* (2013.01); *H01L 29/66757* (2013.01); *H01L 29/66765* (2013.01); *H01L 29/78603* (2013.01); *H01L 29/78675* (2013.01); *H01L 29/78678* (2013.01); *H01L 29/78696* (2013.01); *H01L 27/3276* (2013.01); *H01L 51/0097* (2013.01)

(58) Field of Classification Search
CPC ......... H01L 29/78678; H01L 29/66765; H01L 29/78603; H01L 27/1218; H01L 27/1266; H01L 51/0097; H01L 29/78696; H01L 27/124; H01L 27/1244; H01L 27/1248; H01L 27/127; H01L 27/3262; H01L 27/3276; H01L 27/3288; H01L 27/3297
See application file for complete search history.

(56) References Cited

U.S. PATENT DOCUMENTS

| | | | | |
|---|---|---|---|---|
| 2002/0044230 | A1* | 4/2002 | Yamazaki | H01L 21/02631 |
| | | | | 349/43 |
| 2004/0263705 | A1* | 12/2004 | Seo | H01L 27/1285 |
| | | | | 349/43 |
| 2008/0179594 | A1* | 7/2008 | Oh | H01L 27/3244 |
| | | | | 257/59 |
| 2011/0260168 | A1* | 10/2011 | Toyota | H01L 29/42384 |
| | | | | 257/59 |
| 2012/0241774 | A1 | 9/2012 | Chen et al. | |
| 2015/0187807 | A1* | 7/2015 | Tsuruoka | H01L 23/481 |
| | | | | 257/347 |
| 2016/0079286 | A1 | 3/2016 | Jin et al. | |
| 2017/0301558 | A1* | 10/2017 | Mitarai | H01L 23/5385 |
| 2018/0138260 | A1* | 5/2018 | Kajiyama | H01L 27/3276 |

FOREIGN PATENT DOCUMENTS

| | | | | |
|---|---|---|---|---|
| CN | 105428366 A | 3/2016 | | |
| CN | 106384740 A | 2/2017 | | |
| CN | 107256870 A | 10/2017 | | |
| CN | 109742131 A | * 5/2019 | ......... | H01L 27/3276 |
| WO | WO-2018223696 A1 | * 12/2018 | ......... | H01L 27/1266 |

OTHER PUBLICATIONS

Second Chinese Office Action dated Jan. 31, 2019, received for corresponding Chinese Application No. 201710433423.6.
International Search Report and English translation of Box V of the Written Opinion dated Apr. 9, 2018, received for corresponding Chinese Application No. PCT/CN2018/071747.

* cited by examiner

ARRAY SUBSTRATE, MANUFACTURING METHOD THEREOF, FLEXIBLE DISPLAY PANEL AND DISPLAY DEVICE

CROSS-REFERENCE TO RELATED APPLICATION

The present application claims priority to Chinese Patent Application No. 201710433423.6, filed on Jun. 9, 2017, the entirety of which is incorporated herein by reference.

BACKGROUND

The present disclosure relates to the technical field of displays, and particularly to an array substrate, a manufacturing method thereof, a flexible display panel, and a display device.

The field of display technology is developing rapidly. With the continuous increase in demand for various display products such as notebooks, smartphones, televisions, tablet computers, smart watches, fitness wristbands and the like, more novel display products will emerge in future.

At present, most flexible display panels have frames, and wiring terminals (for example, for binding PAD) are usually disposed on the outer periphery of the display area of the flexible display panel. Frame-free full-screen display products allow better viewing experiences of users, and are likely to drive new consumer markets. On this basis, there exists an urgent technical need to achieve a frame-free full-screen flexible display product.

SUMMARY

Embodiments of the present disclosure provide an array substrate, a manufacturing method thereof, a flexible display panel and a display device, for achieving a frame-free full-screen flexible display product.

Embodiments of the present disclosure provide an array substrate comprising: a flexible base substrate, a thin film transistor on a first surface of the flexible base substrate, and a wiring terminal for transmitting a signal to an electrode of the thin film transistor, on a second surface of the flexible base substrate opposite to the first surface, wherein the electrode of the thin film transistor is electrically connected to the wiring terminal through a via hole penetrating the flexible base substrate.

In an embodiment, the array substrate further comprises a signal wire on the first surface or the second surface of the flexible base substrate; wherein the wiring terminal is connected to the electrode of the thin film transistor through the signal wire.

In an embodiment, the signal wire comprises a plurality of gate electrode signal wires and a plurality of data signal wires insulated from each other.

In an embodiment, the signal wire is disposed on the first surface of the flexible base substrate, a plurality of wiring terminals are provided, and a first insulating layer is disposed between the gate electrode signal wires and the flexible base substrate, wherein each gate electrode signal wire is connected to each wiring terminal in one to one correspondence through a via hole penetrating the first insulating layer and the flexible base substrate.

In an embodiment, a second insulating layer is disposed between the data signal wires and the flexible base substrate, and each data signal wire is connected to each wiring terminal in one to one correspondence through a via hole penetrating the second insulating layer and the flexible base substrate.

In an embodiment, the gate electrode signal wires are disposed in the same layer as that of a gate electrode, and the data signal wires are disposed in the same layer as that of source/drain electrodes.

In an embodiment, the gate electrode is positioned between the source/drain electrodes and the flexible base substrate, and an active layer is disposed between the gate electrode and the flexible base substrate; the first insulating layer comprises: a buffer layer between the active layer and the flexible base substrate, and a gate insulating layer between the gate electrode and the active layer, and the second insulating layer comprises: the buffer layer, the gate insulating layer, and an interlayer dielectric layer between the source/drain electrodes and the gate electrode.

In an embodiment, the gate electrode is positioned between the source/drain electrodes and the flexible base substrate, and an active layer is disposed between the gate electrode and the source/drain electrodes; the first insulating layer comprises a buffer layer between the gate electrode and the flexible base substrate, and the second insulating layer comprises the buffer layer, and a gate insulating layer between the gate electrode and the active layer.

In an embodiment, the source/drain electrodes are positioned between the gate electrode and the flexible base substrate, and an active layer is disposed between the source/drain electrodes and the flexible base substrate; the second insulating layer comprises a buffer layer between the active layer and the flexible base substrate, and the first insulating layer comprises the buffer layer, and a gate insulating layer between the gate electrode and the source/drain electrodes.

Embodiments of the present disclosure further provide a flexible display panel comprising: the array substrate provided in any embodiment of the present disclosure, and a flexible circuit board or integrated circuit on the second surface of the flexible base substrate; wherein the flexible circuit board or integrated circuit is electrically connected to an electrode of the thin film transistor through the wiring terminal.

Embodiments of the present disclosure further provide a display device comprising the flexible display panel provided in any embodiment of the present disclosure.

Embodiments of the present disclosure further provide a manufacturing method of an array substrate, comprising: forming a wiring terminal for transmitting a signal to an electrode of a thin film transistor, on a rigid substrate; forming a flexible base substrate on the rigid substrate with the wiring terminal formed thereon; and forming a thin film transistor on the flexible base substrate, wherein an electrode of the thin film transistor is electrically connected to the wiring terminal through a via hole penetrating the flexible base substrate.

In an embodiment, after forming the wiring terminal and before forming the flexible base substrate, the method further comprises forming a signal wire on the rigid substrate with the wiring terminal formed thereon; or after forming the flexible base substrate, the method further comprises forming a signal wire on the flexible base substrate, wherein the wiring terminal is to be connected to an electrode of the thin film transistor through the signal wire.

In an embodiment, the signal wire comprises a plurality of gate electrode signal wires and a plurality of data signal wires insulated from each other; a plurality of wiring terminals are provided; and forming the plurality of gate electrode signal wires on the flexible base substrate comprises: forming a first insulating layer on the flexible base substrate; forming a via hole at a position on the first insulating layer and the flexible base substrate corresponding to each of the wiring terminals to be connected to the gate electrode signal wires; and forming a plurality of gate electrode signal wires on the first insulating layer with the via hole formed thereon, wherein each gate electrode signal wire is connected to each wiring terminal in one to one correspondence through a via hole penetrating the first insulating layer and the flexible base substrate.

In an embodiment, forming a plurality of data signal wires on the flexible base substrate comprises: forming a second insulating layer on the flexible base substrate; forming a via hole at a position on the second insulating layer and the flexible base substrate corresponding to each of the wiring terminals to be connected to the data signal wires; and forming a plurality of data signal wires on the second insulating layer with the via hole formed thereon, wherein each data signal wire is connected to each wiring terminal in one to one correspondence through a via hole penetrating the second insulating layer and the flexible base substrate.

DETAILED DESCRIPTION

Figure 1:
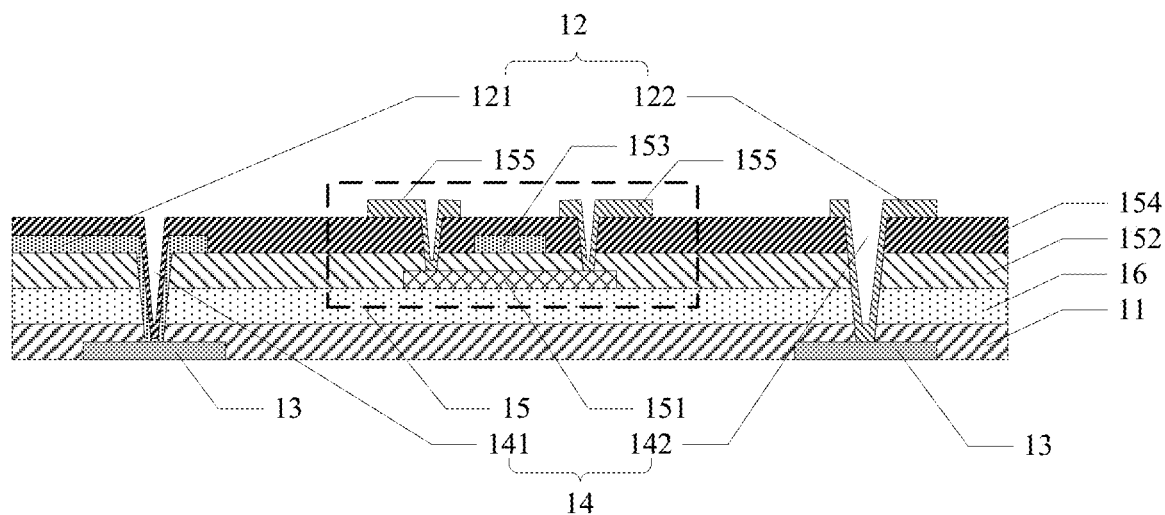
FIG. 1 is a structural schematic diagram of an array substrate provided in an embodiment of the present disclosure.

Embodiments of the present disclosure provide an array substrate, a manufacturing method thereof, a flexible display panel, and a display device for achieving a frame-free full-screen flexible display product.

The technical solutions in embodiments of the present disclosure will be described in detail below in combination with the drawings of the embodiments of the present disclosure. The embodiments described in detail herein constitute only a part of, not all of the embodiments contemplated in view of the present disclosure. All of other embodiments obtained by those skilled in the art based on the embodiments of the present disclosure, without inventive efforts, fall within the protection scope of the present invention.

It should be noted that that the drawings are not necessarily to scale. For example, the thickness and shape of each layer in the drawings of the present disclosure does not indicate a real proportion, and is only intended to schematically illustrate the present disclosure.

Referring to FIG. 1, an embodiment of the present disclosure provides an array substrate comprising: a flexible base substrate 11, a thin film transistor 15 (as indicated by the dashed box in FIG. 1) and a signal wire 12 disposed on a first surface of the flexible base substrate 11, and a wiring terminal 13 for transmitting a signal to an electrode of the thin film transistor 15 disposed on a second surface of the flexible base substrate 11 opposite to the first surface, wherein one end of the signal wire 12 is connected to the electrode of the thin film transistor 15, and the other end is connected to the wiring terminal 13 through a via hole 14 penetrating the flexible base substrate 11.

Here, the signal wire 12 may comprise a plurality of gate electrode signal wires 121 and a plurality of data signal wires 122 insulated from each other.

The signal wire 12, for example, may also comprise a clock signal wire, and this is not limited in the embodiments of the present disclosure.

If an insulating layer is further disposed between the signal wire 12 and the flexible base substrate 11, the signal wire 12 is connected to the wiring terminal 13 through a via hole penetrating the insulating layer and the flexible base substrate 11.

As shown in FIG. 1, the thin film transistor 15 comprises an active layer 151, a gate insulating layer (GI) 152, a gate electrode 153, an interlayer dielectric layer (ILD) 154 and source/drain electrodes 155 sequentially stacked on the flexible base substrate 11.

As shown in FIG. 1, a plurality of wiring terminals 13 are provided, and a first insulating layer is disposed between the gate electrode signal wire 121 and the flexible base substrate 11, and each gate electrode signal wire 121 is connected to one wiring terminal 13 through a via hole 141 penetrating the first insulating layer and the flexible base substrate 11.

As shown in FIG. 1, a second insulating layer is disposed between the data signal wire 122 and the flexible base substrate 11, and each data signal wire 122 is connected to one wiring terminal 13 through a via hole 142 penetrating the second insulating layer and the flexible base substrate 11.

In a particular embodiment, as shown in FIG. 1, the gate electrode signal wire 121 is disposed in the same layer as that of the gate electrode 153, and the data signal wire 122 is disposed in the same layer as that of the source/drain electrodes 155.

In a particular embodiment, as shown in FIG. 1, a buffer layer (Buffer) 16 is disposed between the active layer 151 and the flexible base substrate 11; the first insulating layer comprises the buffer layer 16 and the gate insulating layer 152; and the second insulating layer comprises the buffer layer 16, the gate insulating layer 152 and the interlayer dielectric layer 154.

Further, the signal wire 12 may also be disposed on the second surface of the flexible base substrate 11. In this case, one end of the signal wire 12 is connected to the wiring terminal 13, and the other end is connected to an electrode of the thin film transistor 15 through the via hole 14 disposed in the flexible base substrate 11.

Figure 2:
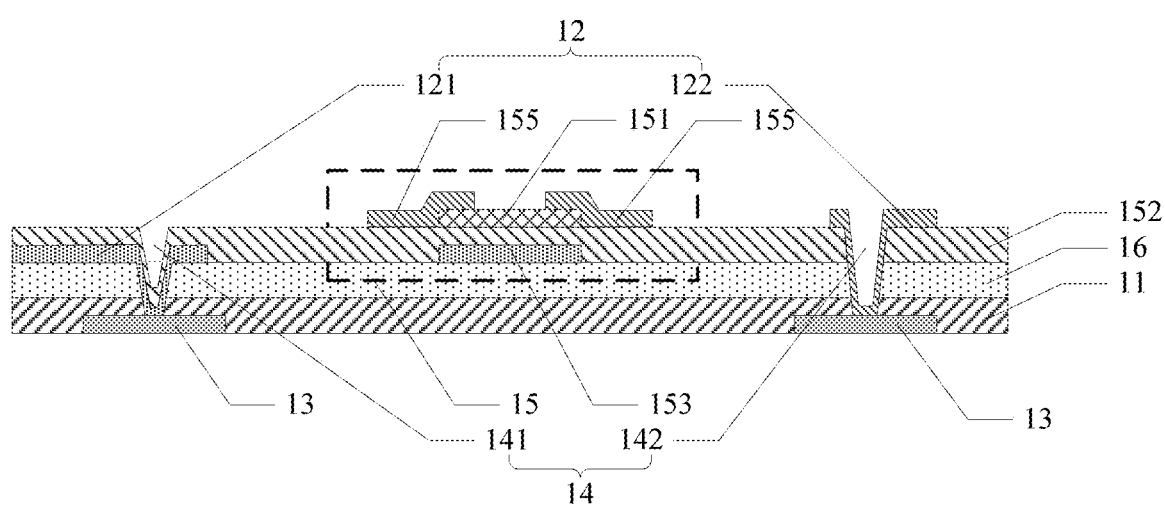
FIG. 2 is a structural schematic diagram of another array substrate provided in an embodiment of the present disclosure.

Referring to FIG. 2, an embodiment of the present disclosure further provides an array substrate, which is similar to the array substrate as shown in FIG. 1. The same portions are not reiterated here, and only different portions are described below.

In the array substrate as shown in FIG. 2, the thin film transistor 15 (as indicated by the dashed box in FIG. 2) comprises a gate electrode 153, a gate insulating layer 152, an active layer 151 and source/drain electrodes 155 sequentially stacked on the flexible base substrate 11.

In a particular embodiment, as shown in FIG. 2, a buffer layer 16 is disposed between the gate electrode 153 and the flexible base substrate 11; the first insulating layer comprises the buffer layer 16; and the second insulating layer comprises the buffer layer 16 and the gate insulating layer 152.

Of course, it is possible that no buffer layer 16 is disposed between the gate electrode 153 and the flexible base substrate 11. In this case, there is no first insulating layer between the gate electrode signal wire 121 and the flexible base substrate 11, that is, the gate electrode signal wire 121 is connected to the wiring terminal 13 only through a via hole disposed in the flexible base substrate 11, and this is not limited in the embodiments of the present disclosure.

Figure 3:
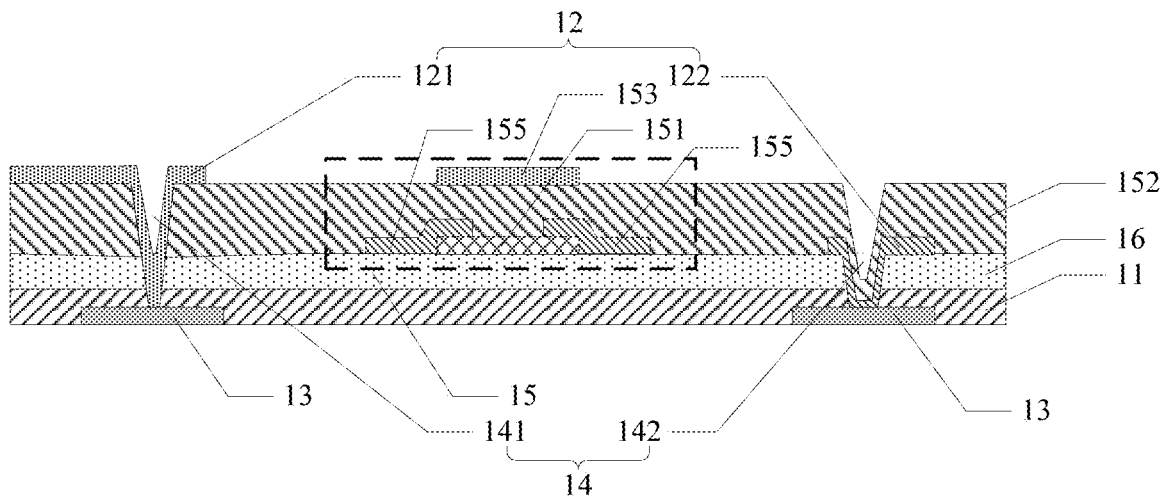
FIG. 3 is a structural schematic diagram of yet another array substrate provided in an embodiment of the present disclosure.

Referring to FIG. 3, an embodiment of the present disclosure further provides an array substrate, which is similar to the array substrate as shown in FIG. 1. The same portions are not reiterated here, and only different portions are described below.

In the array substrate as shown in FIG. 3, the thin film transistor 15 (as indicated by the dashed box in FIG. 3) comprises an active layer 151, source/drain electrodes 155, a gate insulating layer 152 and a gate electrode 153 sequentially stacked on the flexible base substrate 11.

In a particular embodiment, as shown in FIG. 3, a buffer layer 16 is disposed between the active layer 151 and the flexible base substrate 11; the second insulating layer comprises the buffer layer 16; and the first insulating layer comprises the buffer layer 16 and the gate insulating layer 152.

Figure 4:
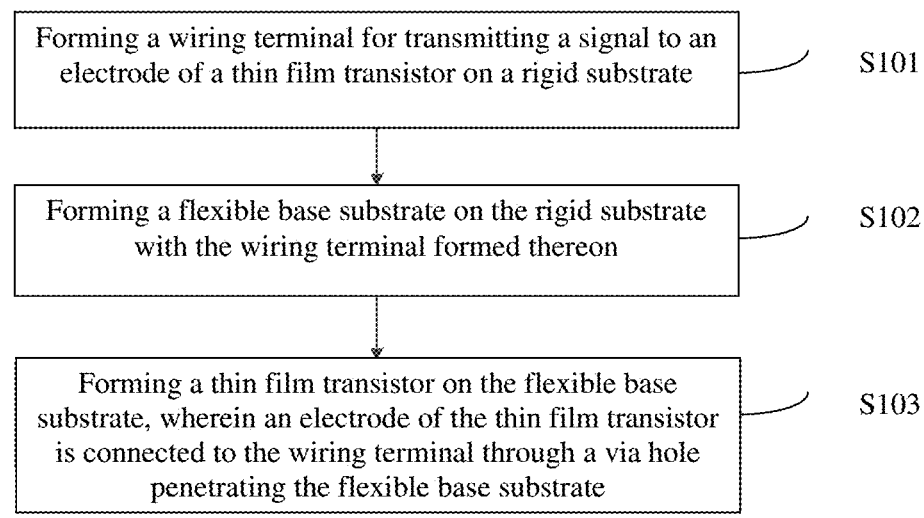
FIG. 4 is a schematic flow chart of a manufacturing method of an array substrate provided in an embodiment of the present disclosure.

Base on the same concept, as shown in FIG. 4, an embodiment of the present disclosure further provides a manufacturing method of an array substrate, comprising the following steps:

S101: Forming a wiring terminal for transmitting a signal to an electrode of a thin film transistor on a rigid substrate; wherein the rigid substrate may be a glass substrate, a quartz substrate, a rock crystal substrate, or the like.

The material of the wiring terminal may be, for example, a metal material such as molybdenum (Mo), aluminum (Al), copper (Cu) and the like.

Forming the wiring terminal on the rigid substrate may comprise: forming a metal layer on the rigid substrate by sputtering; and patterning the metal layer to form the wiring terminal.

S102: Forming a flexible base substrate on the rigid substrate with the wiring terminal formed thereon; wherein, the flexible base substrate may be a transparent organic insulating substrate composed of one selected from the group consisting of polyethersulfone (PES), polyacrylate (PAR), polyetherimide (PEI), polyethelene naphthalate (PEN), polyethylene terephthalate (PET), polyphenylene sulfide (PPS), polyallylate, polyimide resin (PI), polycarbonate (PC), cellulose triacetate (TAC), cellulose acetate propionate (CAP), acrylate and a combination thereof.

S103: Forming a thin film transistor on the flexible base substrate, wherein an electrode of the thin film transistor is electrically connected to the wiring terminal through a via hole penetrating the flexible base substrate.

In a particular embodiment, after forming the wiring terminal and before forming the flexible base substrate, the method may further comprise: forming a signal wire on the rigid substrate with the wiring terminal formed thereon; wherein the wiring terminal is to be connected to an electrode of the thin film transistor through the signal wire.

In another particular embodiment, after forming the flexible base substrate, the method may further comprise: forming a signal wire on the flexible base substrate; wherein the wiring terminal is to be connected to an electrode of the thin film transistor through the signal wire.

Here, the signal wire may comprise a plurality of gate electrode signal wires and a plurality of data signal wires insulated from each other, and a plurality of wiring terminals may be provided.

In a particular embodiment, forming a plurality of gate electrode signal wires on the flexible base substrate may particularly comprise: forming a first insulating layer on the flexible base substrate; forming a via hole at a position on the first insulating layer and the flexible base substrate corresponding to each of the wiring terminals to be connected to the gate electrode signal wires; and forming a plurality of gate electrode signal wires on the first insulating layer with the via hole formed thereon, wherein each gate electrode signal wire is connected to each wiring terminal in one to one correspondence through a via hole penetrating the first insulating layer and the flexible base substrate.

In a particular embodiment, forming a plurality of data signal wires on the flexible base substrate may particularly comprise: forming a second insulating layer on the flexible base substrate; forming a via hole at a position on the second insulating layer and the flexible base substrate corresponding to each of the wiring terminals to be connected to the data signal wires; and forming a plurality of data signal wires on the second insulating layer with the via hole formed thereon, wherein each data signal wire is connected to each wiring terminal in one to one correspondence through a via hole penetrating the second insulating layer and the flexible base substrate.

It should be noted that if the data signal wire is above the gate electrode signal wire, then the second insulating layer=the first insulating layer+a third insulating layer between the gate electrode signal wire and the data signal wire. In the process of manufacturing the array substrate, forming the plurality of gate electrode signal wires and the plurality of data signal wires insulated from each other on the flexible base substrate may particularly comprise: forming a first insulating layer on the flexible base substrate; on the first insulating layer and the flexible base substrate, forming a via hole at a position corresponding to each of the wiring terminals to be connected to the gate electrode signal wires, and forming a via hole at a position corresponding to each of the wiring terminals to be connected to the data signal wires; forming a plurality of gate electrode signal wires on the first insulating layer with the via hole formed thereon; forming a third insulating layer on the flexible base substrate with the plurality of gate electrode signal wires formed thereon; forming a via hole at a position on the third insulating layer corresponding to each of the wiring terminals to be connected to the data signal wires; and forming a plurality of data signal wires on the third insulating layer with the via hole formed thereon.

Here, the third insulating layer may be, for example, a gate insulating layer, an interlayer dielectric layer or the like.

In an embodiment, the area occupied by the via hole pattern of the third insulating layer is not less than the area occupied by the via hole pattern of the first insulating layer.

Forming the plurality of gate electrode signal wires and the plurality of data signal wires insulated from each other on the flexible base substrate may further comprise: forming a first insulating layer on the flexible base substrate; forming a via hole at a position on the first insulating layer and the flexible base substrate corresponding to each of the wiring terminals to be connected to the gate electrode signal wires; and forming a plurality of gate electrode signal wires on the first insulating layer with the via hole formed thereon; forming a third insulating layer on the flexible base substrate with the plurality of gate electrode signal wires formed thereon; forming a via hole at a position on the third insulating layer, the first insulating layer and the flexible base substrate corresponding to each of the wiring terminals to be connected to the data signal wires; and forming a plurality of data signal wires on the third insulating layer with the via hole formed thereon.

Similarly, if the gate electrode signal wire is above the data signal wire, then the first insulating layer=the second insulating layer+a third insulating layer between the gate electrode signal wire and the data signal wire. In the process of manufacturing the array substrate, forming the plurality of gate electrode signal wires and the plurality of data signal wires insulated from each other on the flexible base substrate may particularly comprise: forming a second insulating layer on the flexible base substrate; on the second insulating layer and the flexible base substrate, forming a via hole at a position corresponding to each of the wiring terminals to be connected to the gate electrode signal wires, and forming a via hole at a position corresponding to each of the wiring terminals to be connected to the data signal wires; forming a plurality of data signal wires on the second insulating layer with the via hole formed thereon; forming a third insulating layer on the flexible base substrate with the plurality of gate electrode signal wires formed thereon; forming a via hole at a position on the third insulating layer corresponding to each of the wiring terminals to be connected to the gate electrode signal wires; and forming a plurality of gate electrode signal wires on the third insulating layer with the via hole formed thereon.

In an embodiment, the area occupied by the via hole pattern of the third insulating layer is not less than the area occupied by the via hole pattern of the second insulating layer.

Forming the plurality of gate electrode signal wires and the plurality of data signal wires insulated from each other on the flexible base substrate may further comprise: forming a second insulating layer on the flexible base substrate; forming a via hole at a position on the second insulating layer and the flexible base substrate corresponding to each of the wiring terminals to be connected to the data signal wires; and forming a plurality of data signal wires on the second insulating layer with the via hole formed thereon; forming a third insulating layer on the flexible base substrate with the plurality of gate electrode signal wires formed thereon; forming a via hole at a position on the third insulating layer, the second insulating layer and the flexible base substrate corresponding to each of the wiring terminals to be connected to the gate electrode signal wires; and forming a plurality of gate electrode signal wires on the third insulating layer with the via hole formed thereon.

The manufacturing process of an array substrate provided in an embodiment of the present disclosure will be described in detail below with reference to FIG. 5(a)~FIG. 5(g), by taking an array substrate shown in FIG. 1 as an example.

Figure 5A:
FIG. 5(a) to FIG. 5(h) are schematic flow charts of a manufacturing process of an array substrate provided in an embodiment of the present disclosure.

Step I: Referring to FIG. 5(a), forming a wiring terminal 502 for transmitting a signal to an electrode of a thin film transistor on a glass substrate 501. For example, a metal film layer may be deposited on the glass substrate 501 by using a magnetron sputtering process; the material of the metal film layer may be Mo, Al, Cu or the like; and the metal film layer is patterned with a wet etching method using photoresist to form the wiring terminal 502.

Figure 5B:
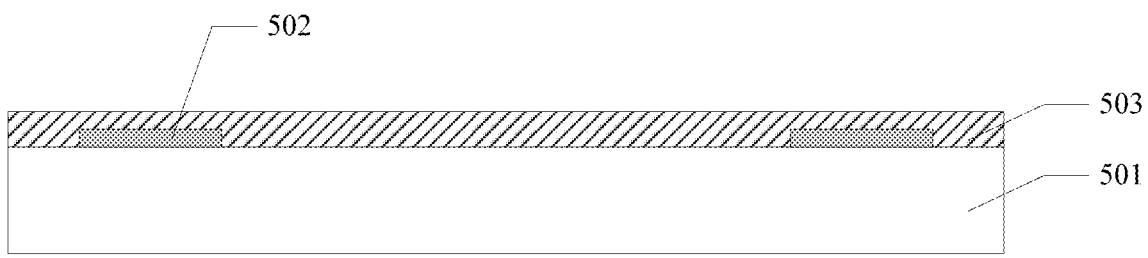

Step II: Referring to FIG. 5(b), forming a flexible base substrate 503 on the glass substrate 501 with the wiring terminal 502 formed thereon; wherein, the material of the flexible base substrate 503 is PI. For example, the flexible base substrate 503 is formed by spin coating a PI film layer on the glass substrate 501 with the wiring terminal 502 formed thereon.

Figure 5C:
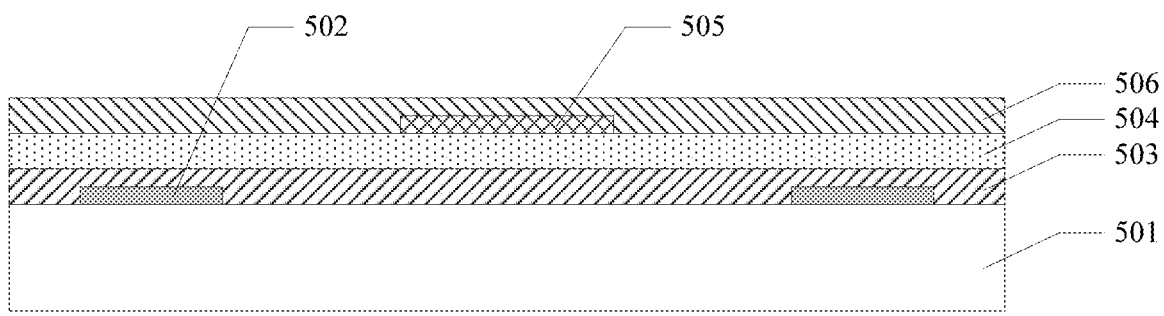

Step III: Referring to FIG. 5(c), forming a buffer layer 504, an active layer 505, and a gate insulating layer 506 sequentially on the flexible base substrate 503. For example, a silicon nitride ($SiN_x$) layer and a silicon oxide ($SiO_x$) layer are sequentially deposited as the buffer layer 504 on the flexible base substrate 503 with a plasma enhanced chemical vapor deposition (PECVD) method; an amorphous silicon (A-Si) layer is formed on the $SiO_x$ layer, and the amorphous silicon, after being dehydrogenated by high temperature annealing, is subjected to crystallization treatment with an excimer laser crystallization (ELA) method, and then a poly-silicon (P-Si) pattern, as the active layer 505, is formed with a dry etching process using photoresist; the poly-silicon active layer 505 is subjected to a threshold voltage heavy doping (Vth Doping) with an ion injection process; and a silicon nitride ($SiN_x$) layer and a silicon oxide ($SiO_x$) layer are sequentially deposited as the gate insulating layer 506 on the active layer 505 with a PECVD method.

Figure 5D:
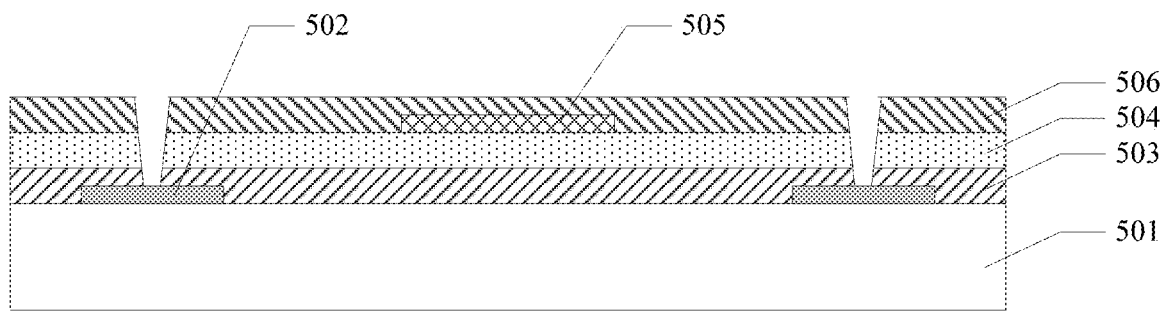

Step IV: Referring to FIG. 5(d), forming a via hole at a position on the gate insulating layer 506, the buffer layer 504 and the flexible base substrate 503 corresponding to each of the wiring terminals 502. For example, the gate insulating layer 506, the buffer layer 504 and the flexible base substrate 503 are patterned with a dry etching method using photoresist, to form the via hole at a position corresponding to each of the wiring terminals 502.

Figure 5E:
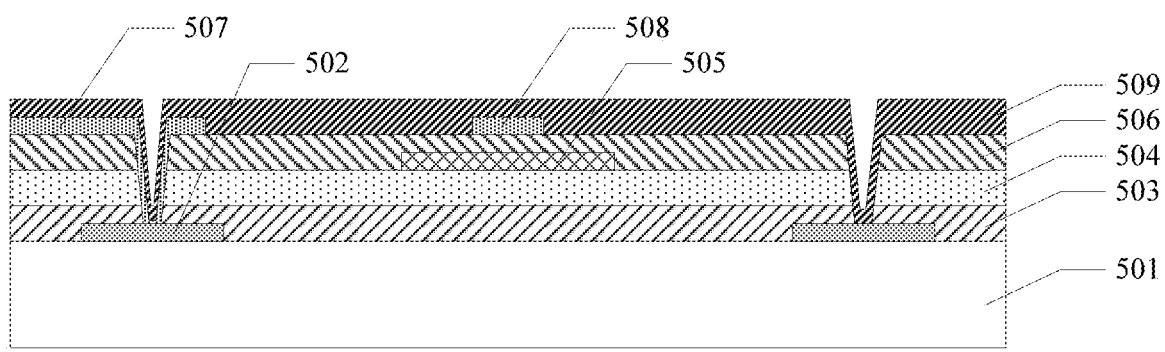

Step V: Referring to FIG. 5(e), forming a plurality of gate electrode signal wires 507, a gate electrode 508 and an interlayer dielectric layer 509 sequentially on the gate insulating layer 506 with the via hole formed thereon; wherein, each gate electrode signal wire 507 is connected to one wiring terminal 502 through a via hole penetrating the gate insulating layer 506, the buffer layer 504 and the flexible base substrate 503. For example, a Mo metal layer may be deposited with a magnetron sputtering process on the gate insulating layer 506 with the via hole formed thereon, and patterned with a wet etching method using photoresist to form the plurality of gate electrode signal wires 507 and the gate electrode 508; the poly-silicon active layer 505 is subjected to source/drain heavy doping (S/D Doping) with an ion injection process; and a silicon nitride ($SiN_x$) layer and a silicon oxide ($SiO_x$) layer are sequentially deposited as the interlayer dielectric layer 509 on the plurality of gate electrode signal wires 507 and the gate electrode 508 with a PECVD method.

Figure 5F:
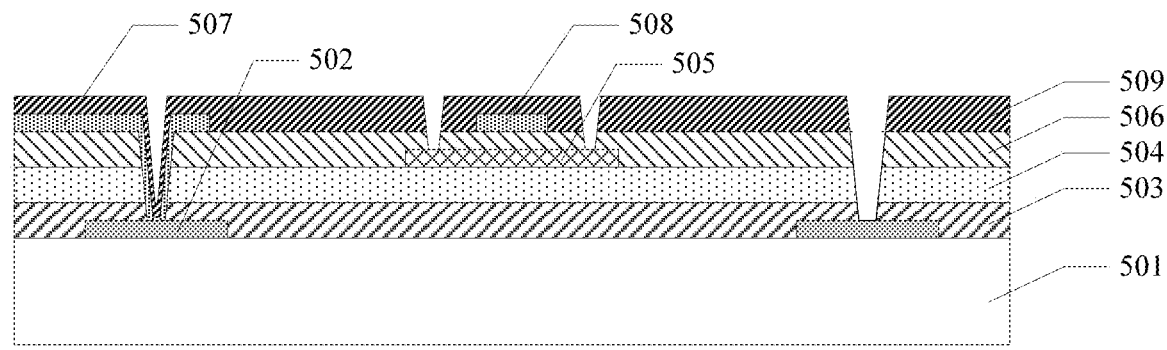

Step VI: Referring to FIG. 5(f), for the interlayer dielectric layer 509, forming a via hole at a position corresponding to each of the wiring terminals 502 to be connected to the data signal wires; and for the interlayer dielectric layer 509 and the gate insulating layer 506, forming a via hole for connecting the active layer 505 and the source/drain electrodes. For example, the interlayer dielectric layer 509 is patterned with exposing and dry etching methods, to form a via hole at a position corresponding to each of the wiring terminals 502 to be connected to the data signal wires; and the interlayer dielectric layer 509 and the gate insulating layer 506 are patterned with exposing and dry etching methods to form a via hole for connecting the active layer 505 and the source/drain electrodes.

Figure 5G:
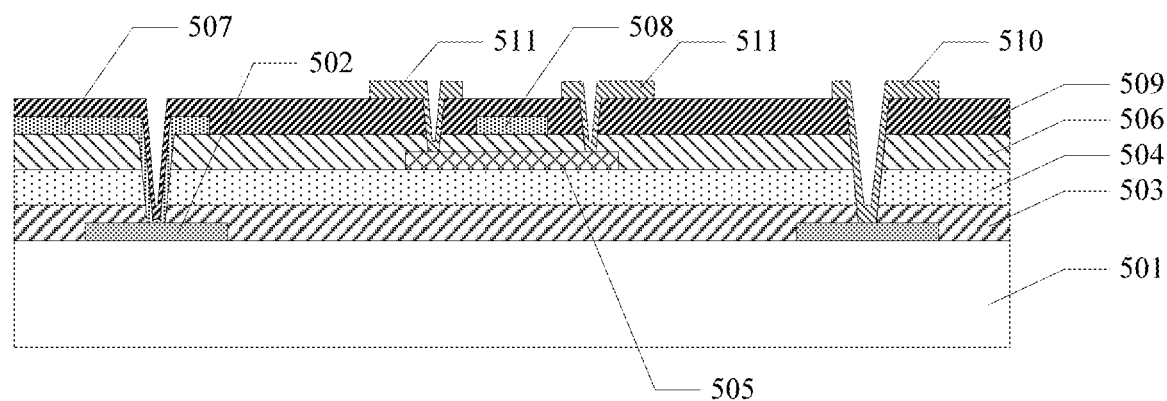

Step VII: Referring to FIG. 5(g), forming a plurality of data signal wires 510 and source/drain electrodes 511 on the interlayer dielectric layer 509 with the via hole formed thereon; wherein, each data signal wire 510 is connected to one wiring terminal 502 through a via hole penetrating the interlayer dielectric layer 509, the gate insulating layer 506, the buffer layer 504 and the flexible base substrate 503. The source/drain electrodes 511 and the active layer 505 are connected through the via hole therebetween. For example, a Ti metal layer, an Al metal layer, and a Ti metal layer may be sequentially deposited with a magnetron sputtering process on the interlayer dielectric layer 509 with the via hole formed thereon, and patterned with a dry etching method using photoresist to form the plurality of data signal wires 510 and the source/drain electrodes 511.

Figure 5H:
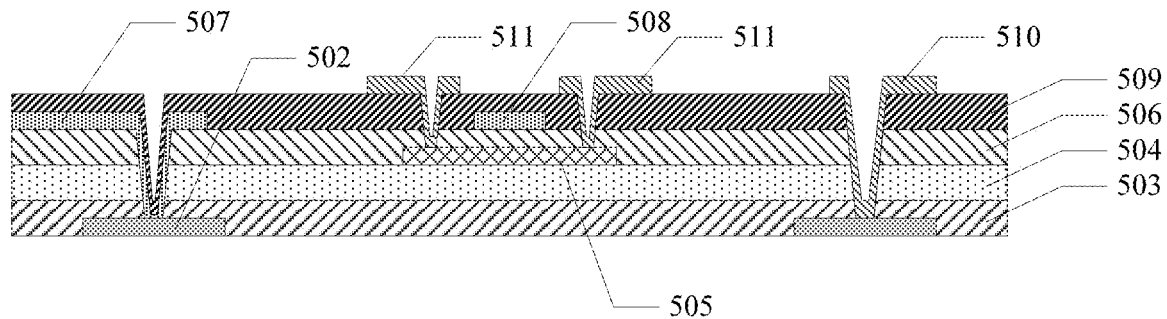

Step VIII: Peeling off the glass substrate 501, wherein the array substrate after peeling is as shown in FIG. 5(h).

Figure 6:
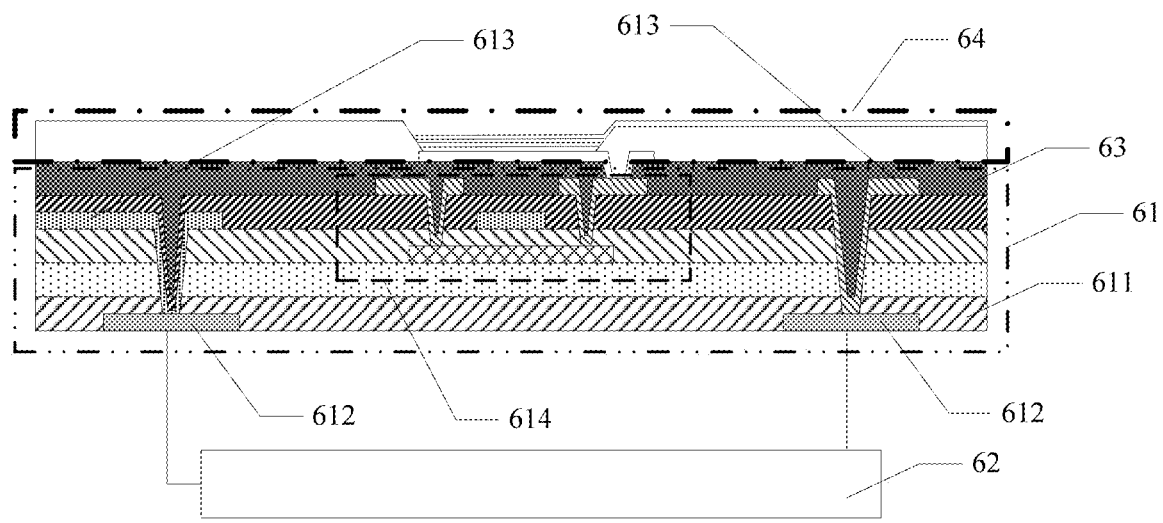
FIG. 6 is a structural schematic diagram of a flexible display panel provided in an embodiment of the present disclosure.

Based on the same concept, referring to FIG. 6, an embodiment of the present disclosure further provides a flexible display panel comprising: an array substrate 61 provided in any embodiment of the present disclosure, and a flexible circuit board 62 disposed on a second surface of a flexible base substrate 611 of the array substrate 61; wherein the flexible circuit board 62 is connected to a signal wire 613 of the array substrate 61 through a wiring terminal 612 of the array substrate 61, and the signal wire 613 is connected to an electrode of a thin film transistor of the array substrate 61. Here, the flexible circuit board 62 may be replaced with an integrated circuit.

In a particular embodiment, as shown in FIG. 6, the above flexible display panel may further comprise: a planarization layer (PLN) 63 disposed on a thin film transistor 614 of the array substrate 61 and an organic light emitting diode 64. Here, the organic light emitting diode 64 may be replaced with a quantum dot light emitting diode.

Based on the same concept, an embodiment of the present disclosure further provides a display device comprising the flexible display panel provided in any embodiment of the present disclosure. The display device may be any product or component having a displaying function such as mobile phone, tablet computer, television, display, notebook, digital photo frame, navigator and the like.

In summary, the embodiments of the present disclosure provide an array substrate, a manufacturing method thereof, a flexible display panel and a display device. The array substrate comprises a flexible base substrate, a thin film transistor disposed on a first surface of the flexible base substrate, and a wiring terminal for transmitting a signal to an electrode of the thin film transistor disposed on a second surface of the flexible base substrate opposite to the first surface, wherein the electrode of the thin film transistor is electrically connected to the wiring terminal through a via hole penetrating the flexible base substrate. Since the wiring terminal is disposed on the back surface of the flexible base substrate, there is no need to reserve a space for disposing the wiring terminal on the outer periphery of the display area of the flexible display panel comprising the array substrate, said wiring terminal being used to connect the flexible circuit board or integrated circuit with the electrode of the thin film transistor. Thus, a frame-free full-screen flexible display product can be achieved.

Obviously, modifications and variations on the present disclosure can be made by those skilled in the art without departing from the spirit and scope of the present invention. As such, if these modifications and variations fall within the scopes of the claims of the present application or equivalent technologies thereof, the present invention is intended to encompass these modifications and variations.

What is claimed is:

1. An array substrate comprising:
   a flexible base substrate;
   a thin film transistor on a first surface of the flexible base substrate;
   a wiring terminal for transmitting a signal to an electrode of the thin film transistor, on a second surface of the flexible base substrate opposite to the first surface; and
   a signal wire on the first surface of the flexible base substrate, the signal wire comprising a plurality of gate electrode signal wires and a plurality of data signal wires insulated from each other,
   wherein an electrode of the thin film transistor is electrically connected to the wiring terminal through the signal wire and a via hole penetrating the flexible base substrate; and
   wherein a plurality of wiring terminals are provided, and a first insulating layer is disposed between the gate electrode signal wires and the flexible base substrate, wherein each gate electrode signal wire is connected to each wiring terminal in one to one correspondence through a via hole penetrating the first insulating layer and the flexible base substrate.

2. The array substrate according to claim 1, wherein a second insulating layer is disposed between the data signal wires and the flexible base substrate, and each data signal wire is connected to each wiring terminal in one to one correspondence through a via hole penetrating the second insulating layer and the flexible base substrate.

3. The array substrate according to claim 2, wherein the gate electrode signal wires are disposed in the same layer as that of a gate electrode, and the data signal wires are disposed in the same layer as that of source/drain electrodes.

4. The array substrate according to claim 3, wherein the gate electrode is positioned between the source/drain electrodes and the flexible base substrate, and an active layer is disposed between the gate electrode and the flexible base substrate; the first insulating layer comprises a buffer layer between the active layer and the flexible base substrate and a gate insulating layer between the gate electrode and the active layer, and the second insulating layer comprises the buffer layer, the gate insulating layer, and an interlayer dielectric layer between the source/drain electrodes and the gate electrode.

5. The array substrate according to claim 3, wherein the gate electrode is positioned between the source/drain electrodes and the flexible base substrate, and an active layer is disposed between the gate electrode and the source/drain electrodes; the first insulating layer comprises a buffer layer between the gate electrode and the flexible base substrate, and the second insulating layer comprises the buffer layer, and a gate insulating layer between the gate electrode and the active layer.

6. The array substrate according to claim 3, wherein source/drain electrodes are positioned between a gate electrode and the flexible base substrate, and an active layer is disposed between the source/drain electrodes and the flexible base substrate; the second insulating layer comprises a buffer layer between the active layer and the flexible base substrate, and the first insulating layer comprises the buffer layer, and a gate insulating layer between the gate electrode and the source/drain electrodes.

7. The array substrate according to claim 1, wherein the flexible base substrate is a transparent organic insulating substrate.

8. A flexible display panel comprising:
   the array substrate according to claim 1; and
   a flexible circuit board or integrated circuit on the second surface of the flexible base substrate, wherein the flexible circuit board or integrated circuit is electrically connected to an electrode of the thin film transistor through the wiring terminal.

9. A display device comprising the flexible display panel according to claim 8.

10. A manufacturing method of the array substrate according to claim 1, comprising:
- forming the wiring terminal on a rigid substrate;
- forming the flexible base substrate on the rigid substrate with the wiring terminal formed thereon; and
- forming the thin film transistor and the signal wire on the flexible base substrate.

11. The manufacturing method according to claim 10, wherein forming the gate electrode signal wires on the flexible base substrate comprises:
- forming a first insulating layer on the flexible base substrate;
- forming a via hole at a position on the first insulating layer and the flexible base substrate corresponding to each of the wiring terminals to be connected to the gate electrode signal wires; and
- forming a plurality of gate electrode signal wires on the first insulating layer with the via hole formed thereon, wherein each gate electrode signal wire is connected to each wiring terminal in one to one correspondence through a via hole penetrating the first insulating layer and the flexible base substrate.

12. The manufacturing method according to claim 11, wherein forming the data signal wires on the flexible base substrate comprises:
- forming a second insulating layer on the flexible base substrate;
- forming a via hole at a position on the second insulating layer and the flexible base substrate corresponding to each of the wiring terminals to be connected to the data signal wires; and
- forming a plurality of data signal wires on the second insulating layer with the via hole formed thereon, wherein each data signal wire is connected to each wiring terminal in one to one correspondence through a via hole penetrating the second insulating layer and the flexible base substrate.

13. The manufacturing method according to claim 10, wherein after forming the thin film transistor on the flexible base substrate, the method further comprises:
- peeling off the rigid substrate.

* * * * *